United States Patent
Lee et al.

(10) Patent No.: US 10,275,344 B2
(45) Date of Patent: Apr. 30, 2019

(54) METHOD FOR VERIFYING OPERATIONS FOR COMMON APPLICATION DEVELOPMENT OF IN-VEHICLE INFOTAINMENT SYSTEM AND MOBILE TERMINAL

(71) Applicant: LG ELECTRONICS INC., Seoul (KR)

(72) Inventors: Minhun Lee, Seoul (KR); Sungha Choi, Seoul (KR)

(73) Assignee: LG Electronics Inc., Seoul (KR)

( * ) Notice: Subject to any disclaimer, the term of this patent is extended or adjusted under 35 U.S.C. 154(b) by 218 days.

(21) Appl. No.: 15/123,366

(22) PCT Filed: Mar. 3, 2015

(86) PCT No.: PCT/KR2015/002028
§ 371 (c)(1),
(2) Date: Apr. 5, 2017

(87) PCT Pub. No.: WO2015/133786
PCT Pub. Date: Sep. 11, 2015

(65) Prior Publication Data
US 2017/0228311 A1    Aug. 10, 2017

Related U.S. Application Data

(60) Provisional application No. 61/946,895, filed on Mar. 3, 2014.

(51) Int. Cl.
*G06F 11/36* (2006.01)
*G06F 17/50* (2006.01)
*G06F 9/455* (2018.01)

(52) U.S. Cl.
CPC .......... *G06F 11/3688* (2013.01); *G06F 9/455* (2013.01); *G06F 11/3664* (2013.01); *G06F 11/3668* (2013.01); *G06F 17/5009* (2013.01)

(58) Field of Classification Search
CPC ............. G06F 11/3664; G06F 11/3668; G06F 11/3672; G06F 11/3688; G06F 11/3692;
(Continued)

(56) References Cited

U.S. PATENT DOCUMENTS 5,805,867 A * 9/1998 Kodaira ................ G06F 11/261
  703/21
6,918,066 B2 * 7/2005 Dutta .................. G06F 17/3089
  707/E17.116
(Continued)

FOREIGN PATENT DOCUMENTS

KR    10-2006-0120080      11/2006

OTHER PUBLICATIONS

Gulden, M., Smart Things—Accessories in the Car, Advances in Media Technology, Jan. 16, 2012, pp. 9-16, [retrieved on Dec. 7, 2018], Retrieved from the Internet: <URL:https://pdfs.semanticscholar.org/bc8f/a44f0e5d968c5b7040276e2fe16d0de69040.pdf#page=15>.*

(Continued)

*Primary Examiner* — Geoffrey R St Leger
(74) *Attorney, Agent, or Firm* — Fish & Richardson P.C.

(57) ABSTRACT

A method capable of verifying operations of a common mobile application for providing an interworking function between an in-vehicle infotainment system and a mobile terminal is disclosed. A method for verifying an application using a simulator may comprise: a step for running a first simulator including a client simulator and a second simulator corresponding to a server simulator; a step for inputting client setting information and server setting information to the first simulator; a step for starting a session between the first simulator and the second simulator; a step for running an application to be verified; a step for registering, to the server simulator, the application to be verified; a step for (Continued)

obtaining, by the application to be verified, a replacer module from the second simulator; and a step for registering, to the second simulator, a function for receiving status change information of the application to be verified.

16 Claims, 10 Drawing Sheets

(58) Field of Classification Search
CPC .. G06F 11/3696; G06F 9/455; G06F 9/45529; G06F 17/5009
USPC ......................................... 717/124, 134, 135
See application file for complete search history.

(56) References Cited

U.S. PATENT DOCUMENTS

| | | | | |
|---|---|---|---|---|
| 7,143,025 | B2* | 11/2006 | Walsh | H04L 63/0807 |
| | | | | 703/21 |
| 8,738,346 | B2* | 5/2014 | Bolding | G06F 17/5009 |
| | | | | 703/13 |
| 8,897,144 | B2* | 11/2014 | Hui | H04L 65/605 |
| | | | | 370/241 |
| 9,760,385 | B2* | 9/2017 | Brace | G06F 9/455 |
| 2002/0019969 | A1* | 2/2002 | Hellestrand | G06F 11/261 |
| | | | | 716/102 |
| 2002/0059052 | A1* | 5/2002 | Bloch | G06F 17/5022 |
| | | | | 703/13 |
| 2003/0061283 | A1* | 3/2003 | Dutta | G06F 17/3089 |
| | | | | 709/204 |
| 2004/0117170 | A1* | 6/2004 | Walsh | H04L 63/0807 |
| | | | | 703/17 |
| 2004/0221273 | A1* | 11/2004 | Sandham | G06F 9/44589 |
| | | | | 717/134 |
| 2004/0236562 | A1* | 11/2004 | Beckmann | G06F 9/546 |
| | | | | 703/22 |
| 2006/0070042 | A1* | 3/2006 | Muratori | G06F 9/544 |
| | | | | 717/135 |
| 2006/0282248 | A1* | 12/2006 | Kageyama | G06F 17/5009 |
| | | | | 703/13 |
| 2008/0052049 | A1* | 2/2008 | Moriyama | G06F 17/5009 |
| | | | | 703/2 |
| 2008/0177522 | A1* | 7/2008 | Bolding | G06F 17/5009 |
| | | | | 703/13 |
| 2009/0281779 | A1* | 11/2009 | Kajitani | G05B 17/02 |
| | | | | 703/7 |
| 2010/0100365 | A1* | 4/2010 | Moriyama | G06F 17/5009 |
| | | | | 703/8 |
| 2012/0030512 | A1 | 2/2012 | Wadhwa et al. | |
| 2013/0066518 | A1 | 3/2013 | Chen et al. | |
| 2013/0096904 | A1* | 4/2013 | Hui | H04L 65/605 |
| | | | | 703/21 |
| 2013/0103779 | A1 | 4/2013 | Baim et al. | |
| 2014/0172393 | A1* | 6/2014 | Kang | G06F 17/5009 |
| | | | | 703/6 |
| 2014/0331205 | A1* | 11/2014 | Singh | G06F 11/3688 |
| | | | | 717/124 |
| 2015/0143091 | A1* | 5/2015 | Brace | G06F 9/455 |
| | | | | 713/1 |
| 2016/0300000 | A1* | 10/2016 | Takeshita | G05B 19/41885 |

OTHER PUBLICATIONS

Lee, K., et al., AMC: verifying user interface properties for vehicular applications, Proceeding of the 11th annual international conference on Mobile systems, applications, and services, 2013, pp. 1-12, [retrieved on Dec. 7, 2018], Retrieved from the Internet: <URL:http://dl.acm.org/>.*

International Search Report and Written Opinion in International Application No. PCT/KR2015/002028, dated Jun. 19, 2015, 12 pages (with English translation).

* cited by examiner

[FIG 1]
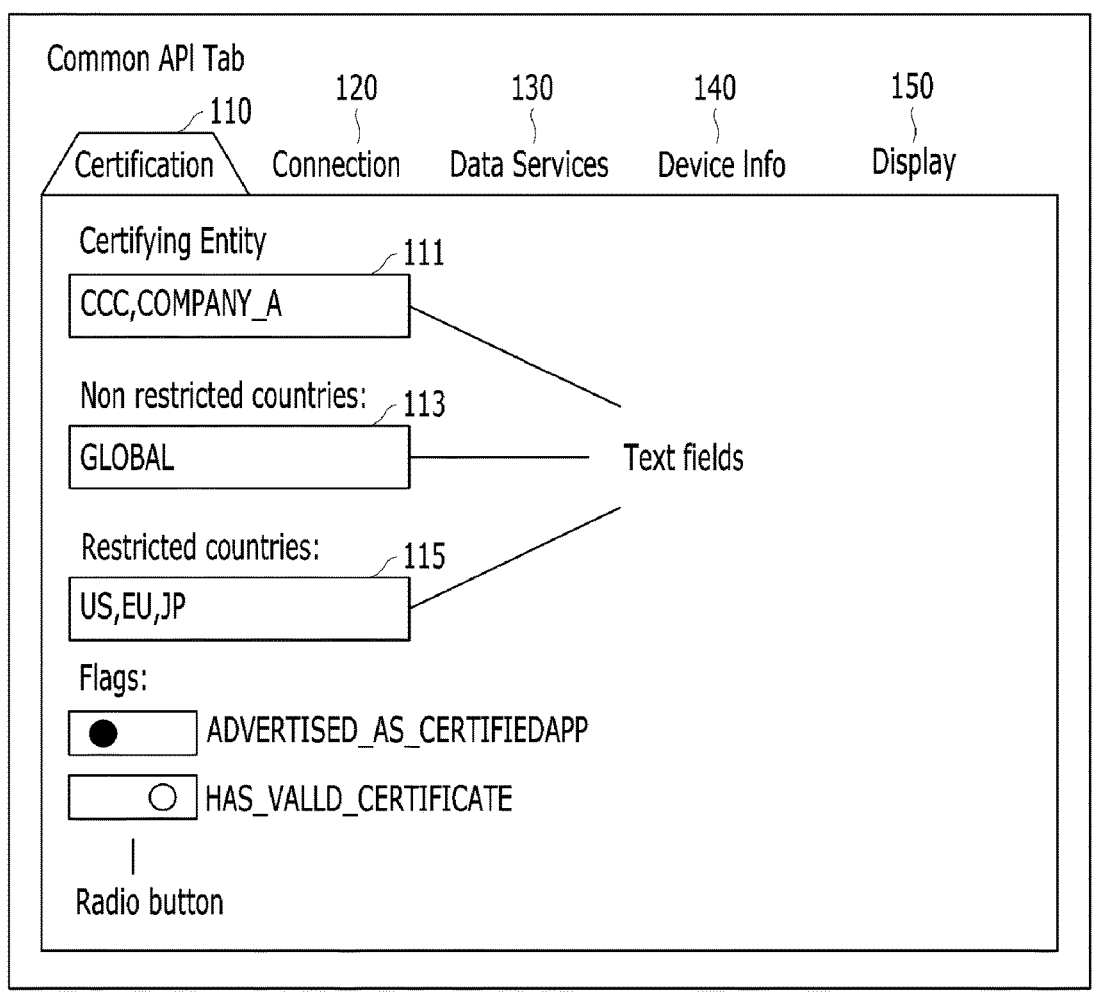

[FIG 2]
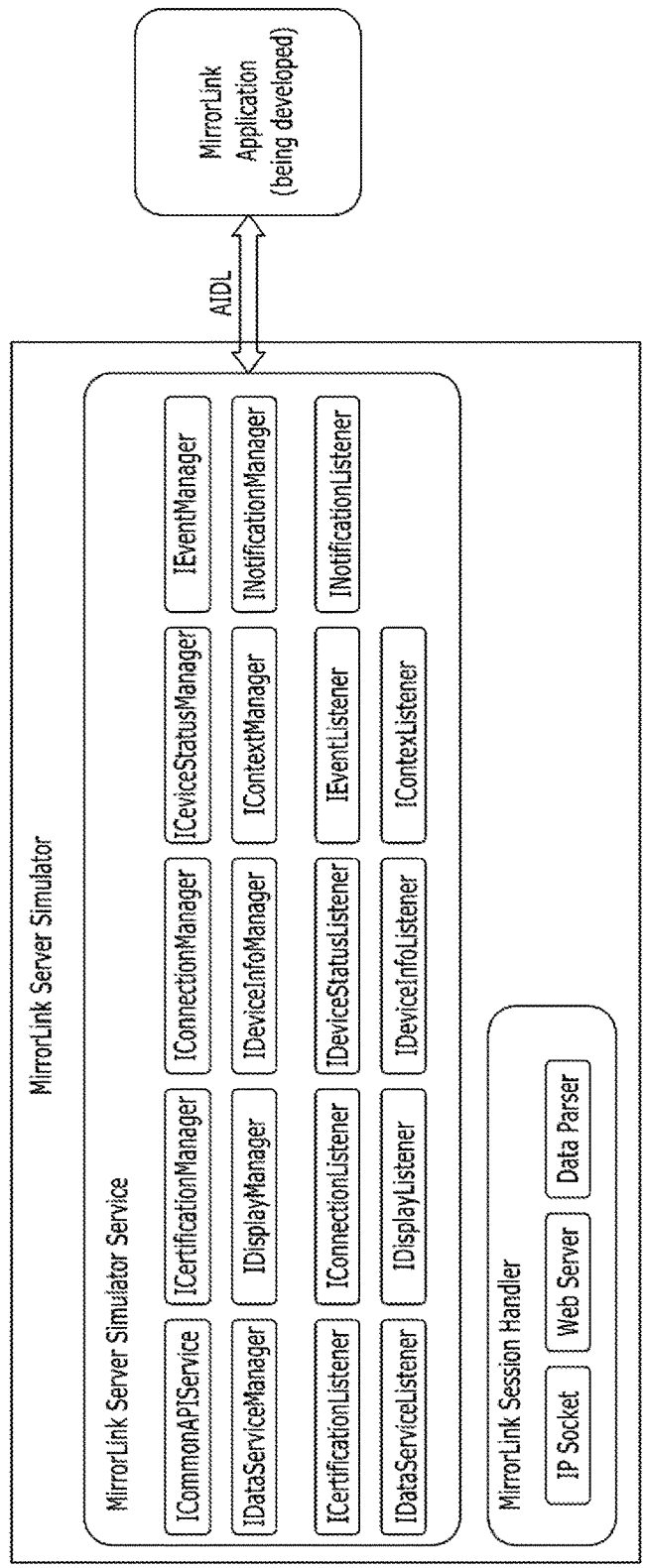

[FIG 3]
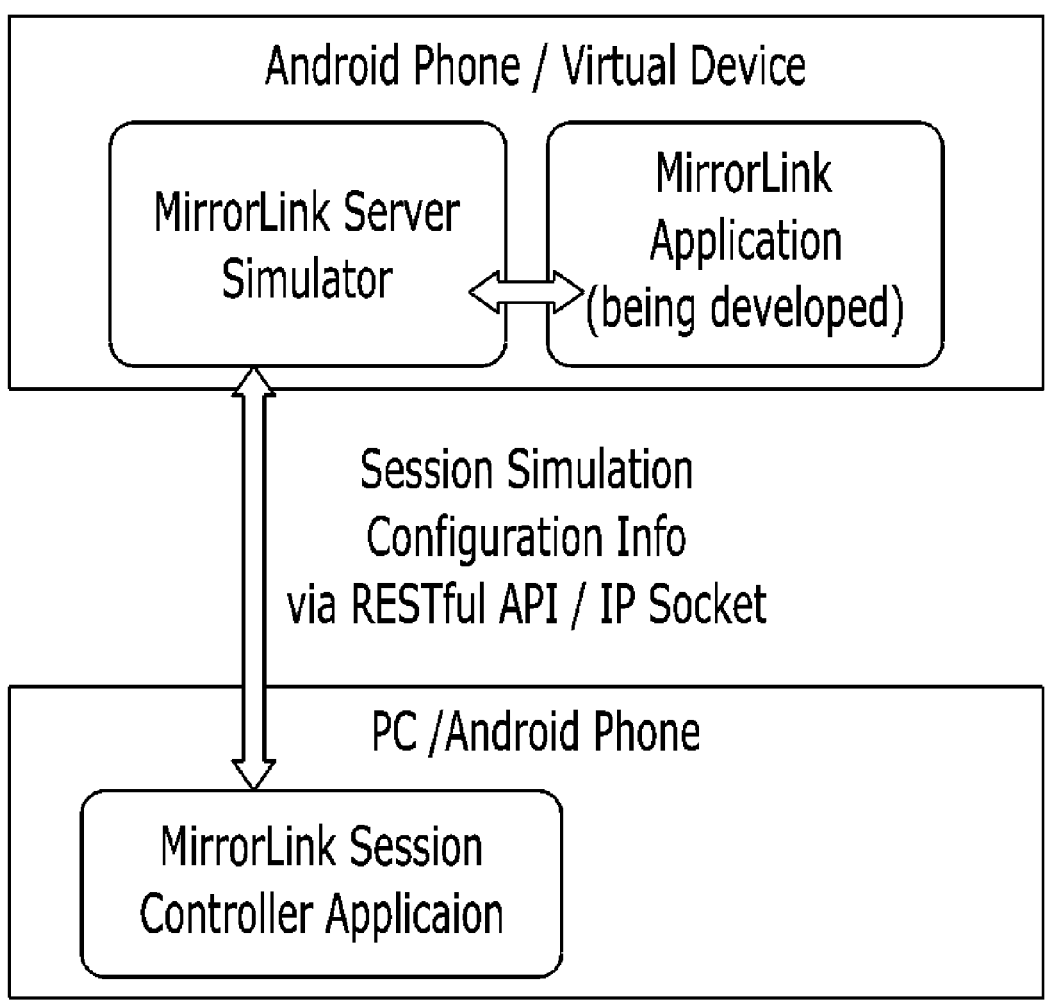

[FIG 4]
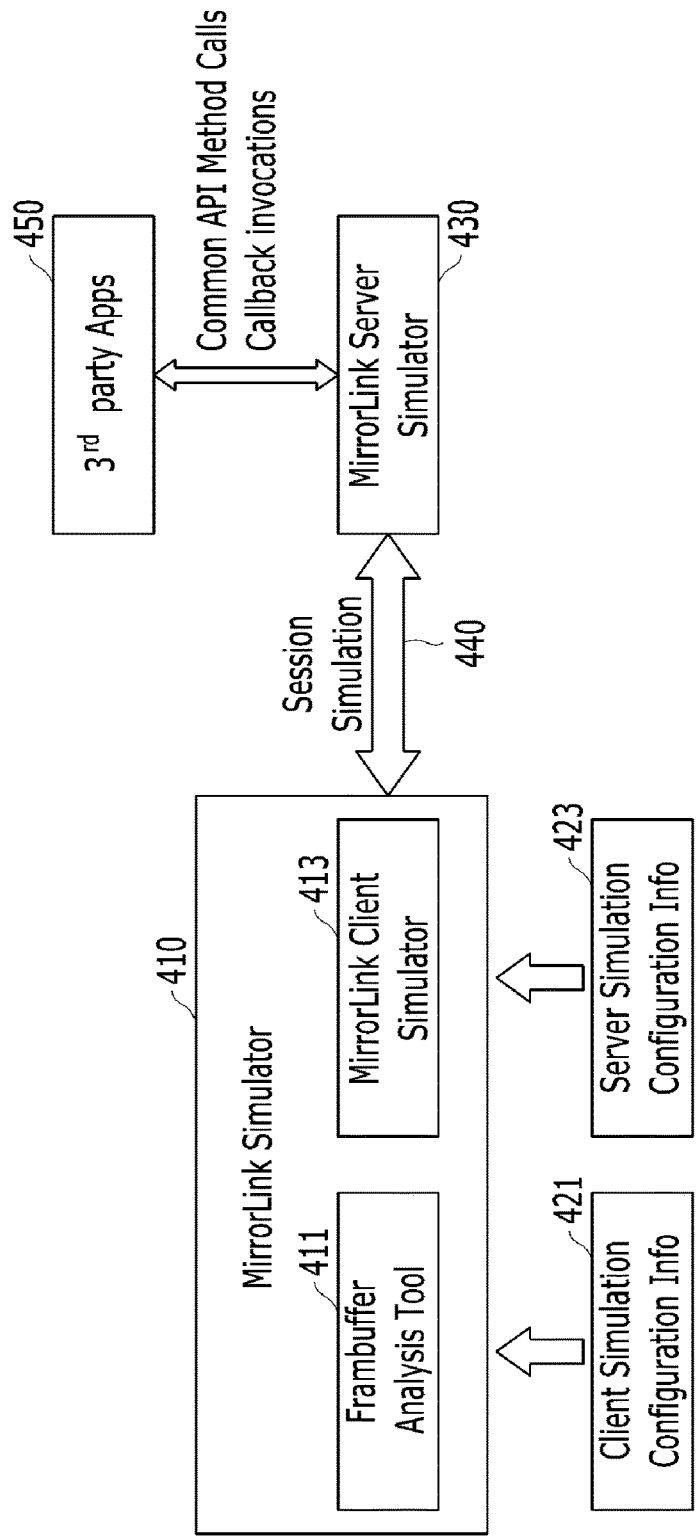

[FIG 5]
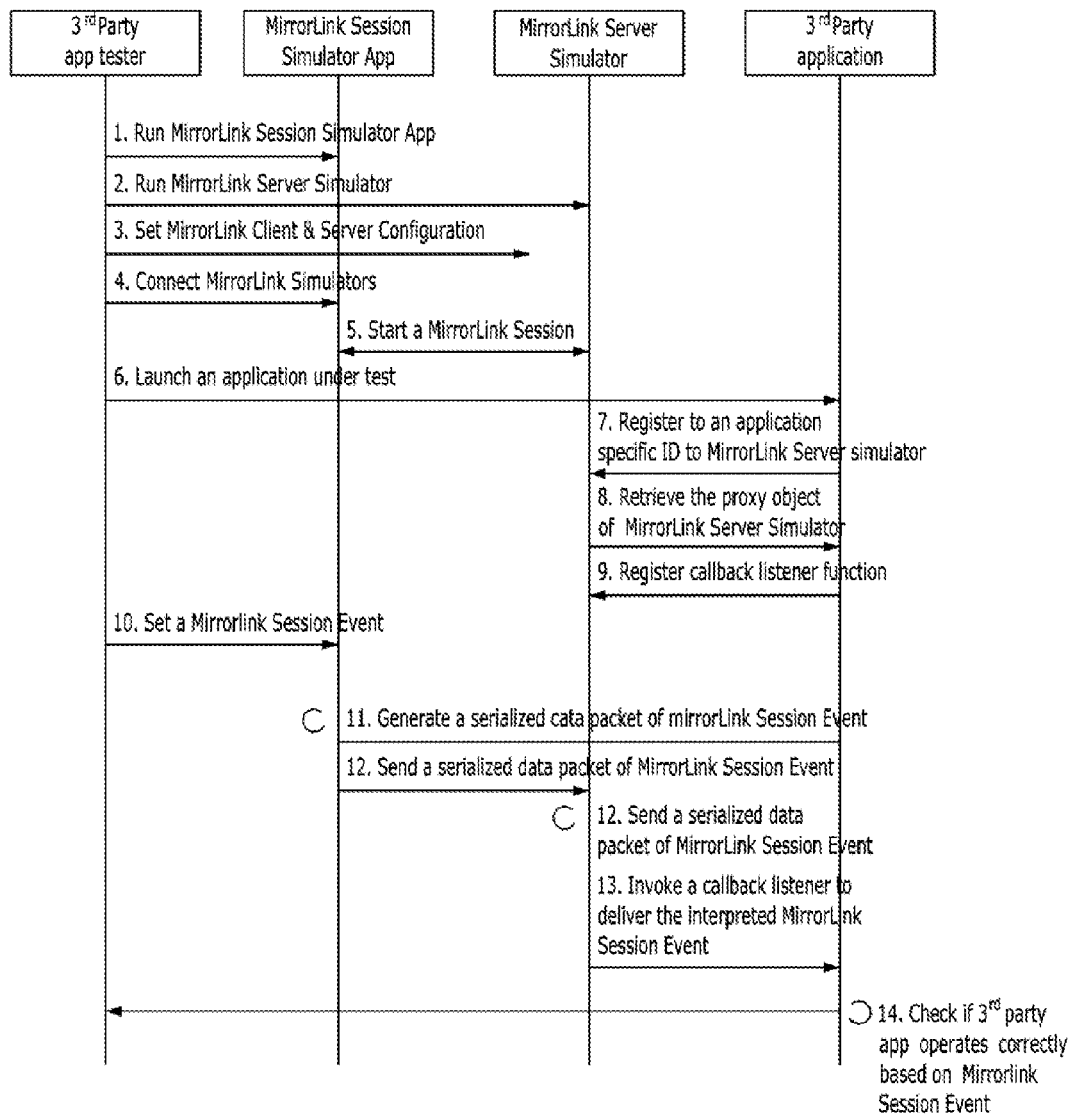

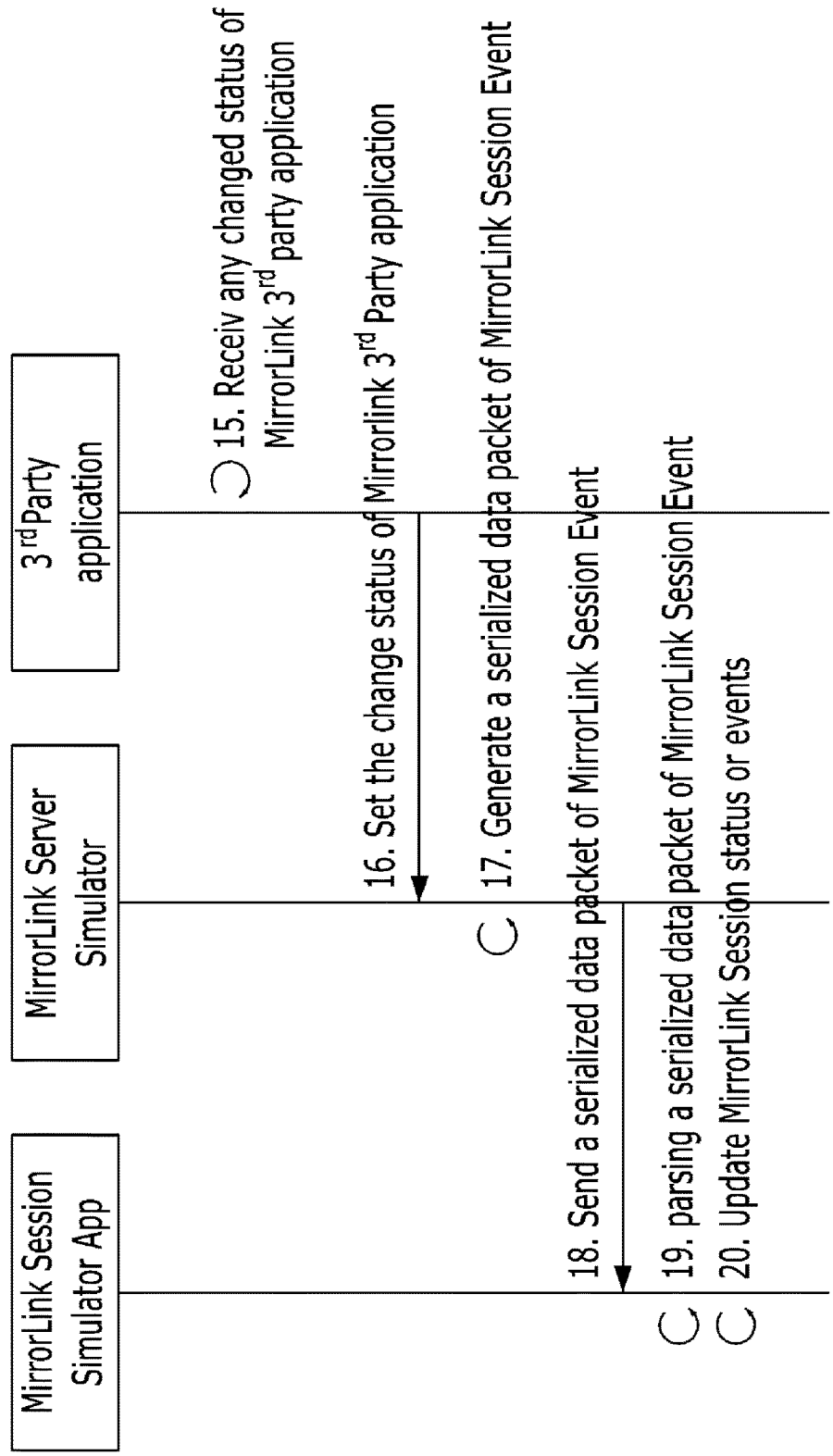
[FIG 6]

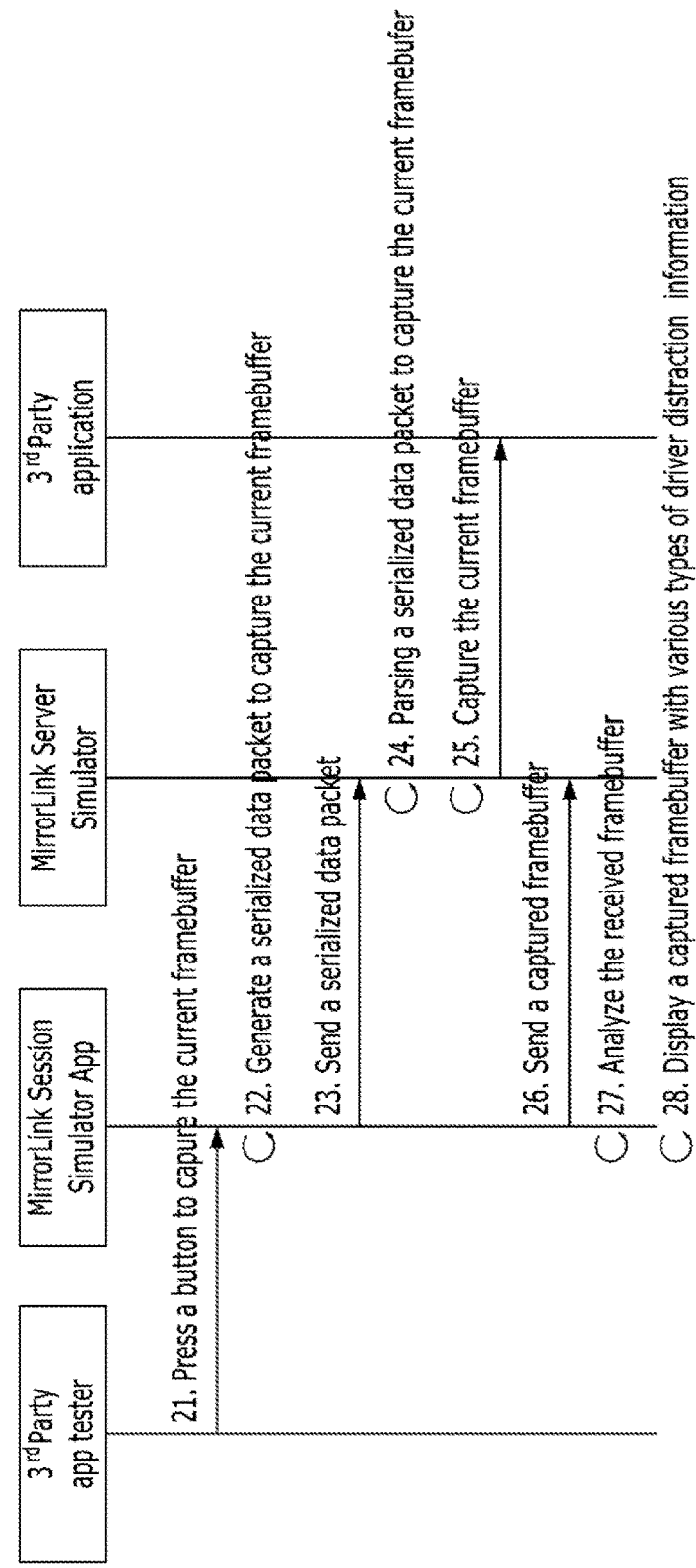
[FIG 7]

[FIG 8]
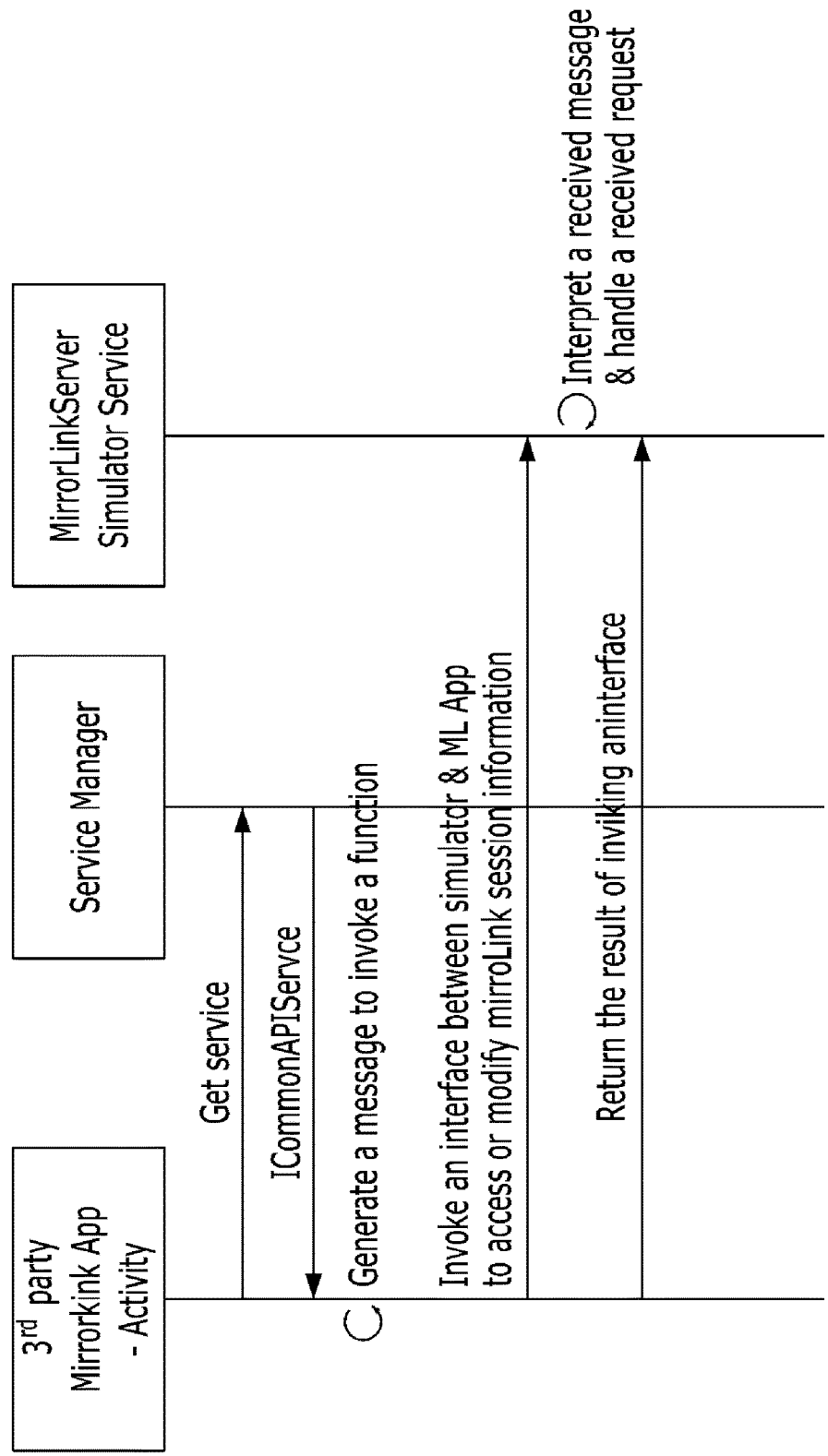

[FIG 9]
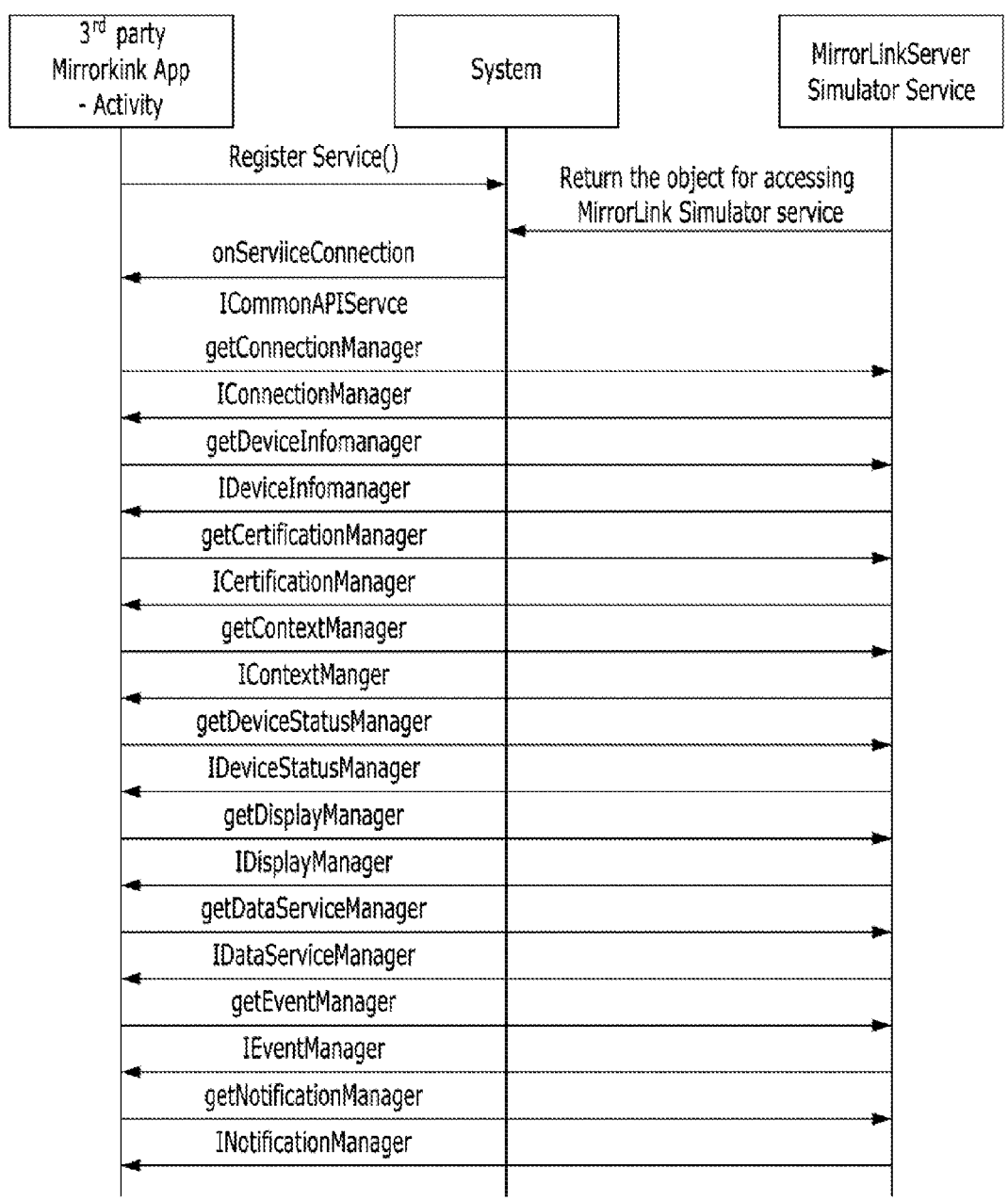

[FIG 10]
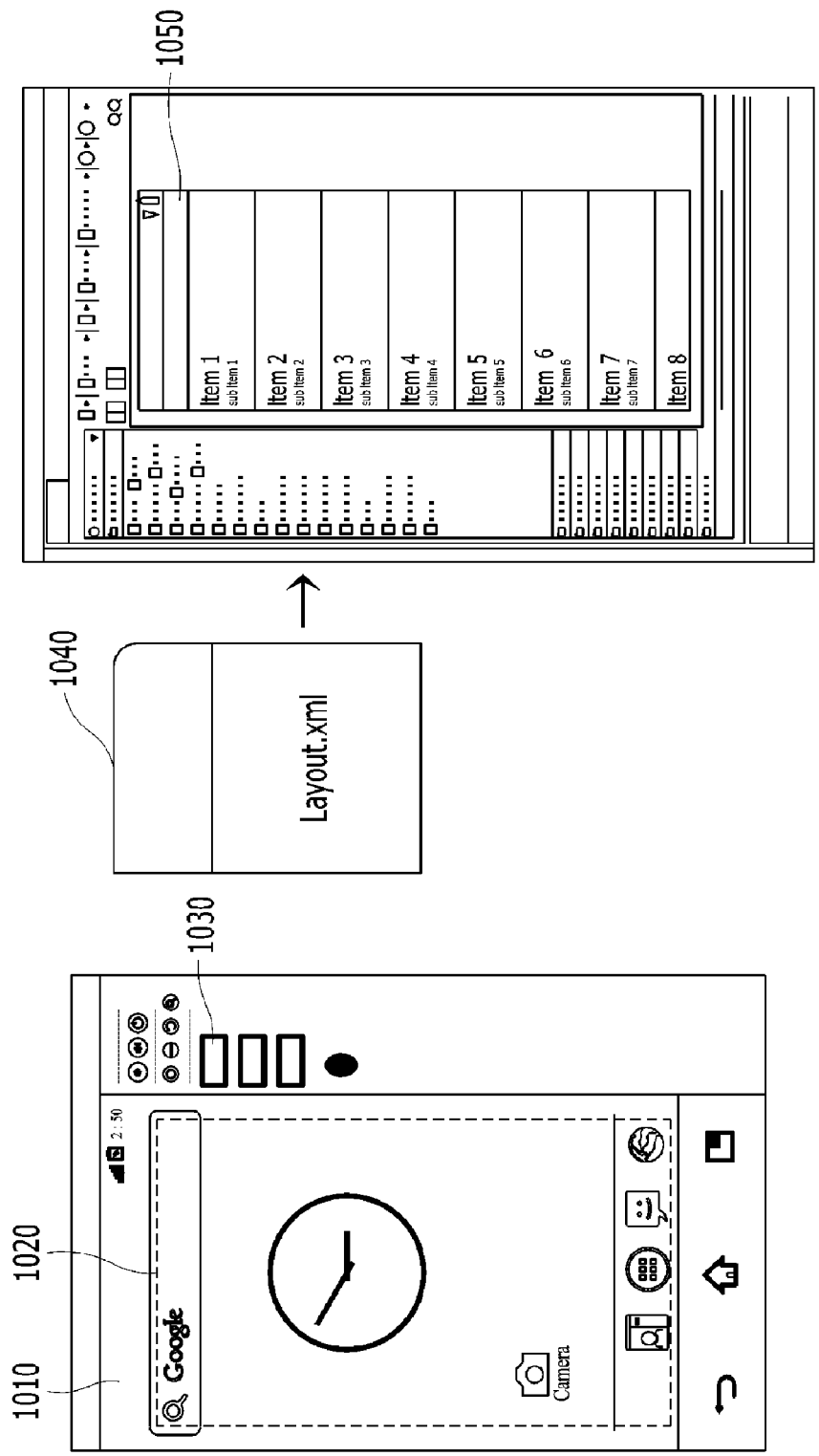

the benefit of U.S. Provisional Application No. 61/946,895, filed

METHOD FOR VERIFYING OPERATIONS FOR COMMON APPLICATION DEVELOPMENT OF IN-VEHICLE INFOTAINMENT SYSTEM AND MOBILE TERMINAL

CROSS REFERENCE TO RELATED APPLICATIONS

This application is a U.S. National Phase Application under 35 U.S.C. § 371 of International Application PCT/KR2015/002028, filed on Mar. 3, 2015, which claims the benefit of U.S. Provisional Application No. 61/946,895, filed on Mar. 3, 2014, the entire contents of which are hereby incorporated by reference in their entireties.

TECHNICAL FIELD

The present invention relates to a simulator for facilitating application development, and more particularly, to a method of verifying an operation of a common mobile application for providing an interconnecting function between an in-vehicle infotainment system and a mobile terminal.

BACKGROUND ART

Owing the generalization and popularization of smartphones, the demand for using various application and services provided by a smartphone in a vehicle is increasingly rising. Particularly, it is expected that a connectivity controller (ECU) will play an important role in providing services using an application of a smartphone among services of WI (In-Vehicle Infotainment) system.

In order to meet the consumer's needs and occupy the connectivity ECU market expected to grow rapidly, vehicle manufacturers make ongoing efforts to research and develop various connectivity ECU technologies and IVI system-to-smartphone interconnecting technologies (e.g., MirrorLink, Apple Digital iPod Out, Google Android Auto, etc.).

The connectivity ECU technologies control a connection between an IVI system and a smartphone and provide an environment for sharing an application and service of the smartphone according to a determined protocol. Hence, only a smartphone application developed on the basis of the connectivity ECU technology can provide an interconnecting function between an IVI system and a smartphone.

Therefore, in developing an application therefor, the needs for a tool for a $3^{rd}$ party application developer to conveniently verify an operation of an application developed by the $3^{rd}$ party application developer by easily providing a virtual environment of connecting a smartphone and an IVI system actually based on a determined protocol without a real vehicle or additional equipments are increasingly rising.

DISCLOSURE

Technical Tasks

One technical task of the present invention is to provide an environment for facilitating a verification of an operation of an application for running an interconnecting function between a vehicle and a mobile terminal.

Particularly, the technical task of the present invention is to provide a simulator capable of virtually providing the same environment of an infotainment system of a real vehicle without the infotainment system or the vehicle and an application operation verifying method using the simulator.

The technical tasks that can be achieved through the present invention are not limited to what has been particularly described hereinabove and other technical objects not described herein will be more clearly understood by persons skilled in the art from the following detailed description.

Technical Solution

In an aspect of the present invention, provided herein is a method of verifying an application using a simulator, including the steps of running a $1^{st}$ simulator including a client simulator and a $2^{nd}$ simulator corresponding to a server simulator, inputting a client configuration information and a server configuration information to the $1^{st}$ simulator, starting a session between the $1^{st}$ simulator and the $2^{nd}$ simulator, running a verification target application, registering the verification target application at the server simulator, obtaining a replacer module for the verification target application from the $2^{nd}$ simulator, and registering a function for receiving a status change information of the verification target application at the $2^{nd}$ simulator.

Preferably, the method may further include the steps of setting a $1^{st}$ session event in the $1^{st}$ simulator, transmitting an information on the $1^{st}$ session event to the $2^{nd}$ simulator from the $1^{st}$ simulator, transmitting the information on the $1^{st}$ session event to the verification target application from the $2^{nd}$ simulator via the registered function, and performing an operation corresponding to the information on the $1^{st}$ session event in the verification target application.

More preferably, the step of transmitting the information on the $1^{st}$ session event to the $2^{nd}$ simulator from the $1^{st}$ simulator may include the steps of generating a serialized data packet including the information on the $1^{st}$ session event from the $1^{st}$ simulator, transmitting the serialized data packet to the $2^{nd}$ simulator, and parsing to interpret the serialized data packet in the $2^{nd}$ simulator.

Preferably, the method may further include the steps of triggering a $2^{nd}$ session event according to a status change in the verification target application, configuring an information on the $2^{nd}$ session event in the $2^{nd}$ simulator, transmitting the information on the $2^{nd}$ session event to the $1^{st}$ simulator from the $2^{nd}$ simulator, and updating a status of the session using the information on the $2^{nd}$ session even in the $1^{st}$ simulator.

More preferably, the step of transmitting the information on the $2^{nd}$ session event to the $1^{st}$ simulator from the $2^{nd}$ simulator may include the steps of generating a serialized data packet including the information on the $2^{nd}$ session event from the $2^{nd}$ simulator, transmitting the serialized data packet to the $1^{st}$ simulator, and parsing to interpret the serialized data packet in the $1^{st}$ simulator.

Preferably, the $1^{st}$ simulator may further include a framebuffer analysis tool configured to output a framebuffer visually.

More preferably, the method may further include the steps of inputting a framebuffer capture command to the $1^{st}$ simulator, transmitting the framebuffer capture command to the $2^{nd}$ simulator from the $1^{st}$ simulator, capturing a current framebuffer of the verification target application in the $2^{nd}$ simulator, transmitting the captured framebuffer to the $1^{st}$ simulator from the $2^{nd}$ simulator, and outputting the captured framebuffer from the $1^{st}$ simulator.

More preferably, the step of transmitting the framebuffer capture command to the $2^{nd}$ simulator from the $1^{st}$ simulator may include the steps of generating a serialized data packet including the framebuffer capture command from the $1^{st}$ simulator, transmitting the serialized data packet to the $2^{nd}$ simulator, and parsing to interpret the serialized data packet in the $2^{nd}$ simulator.

Preferably, the client simulator may correspond to an environment of an infotainment system of a vehicle and the server simulator may correspond to an environment of a smartphone. Preferably, the $1^{st}$ simulator, the $2^{nd}$ simulator and the verification target application may use MirrorLink technology.

Advantageous Effects

According to the present invention, an operation of an application for running an interconnecting function between a vehicle and a mobile terminal can be verified more conveniently.

Particularly, according to the present invention, since an environment working like actually connecting an infotainment system of a vehicle and a smartphone together is provided, it is unnecessary for an application developer to actually prepare a vehicle or an infotainment system of the vehicle.

Moreover, according to the present invention, as information exchanged between a vehicle and a smartphone is visualized, operation verification of an application is further facilitated.

Effects according to the present invention are not limited to what has been particularly described hereinabove and other advantages not described herein will be more clearly understood by persons skilled in the art from the following detailed description of the present invention.

DESCRIPTION OF DRAWINGS

FIG. 1 shows one example of a configuration of a user interface for an information input of a MirrorLink session simulator according to one embodiment of the present invention.

FIG. 2 shows one example of a high level architecture structure of a MirrorLink session simulator according to one embodiment of the present invention.

FIG. 3 shows one example of a flow between a MirrorLink session simulator and a MirrorLink server simulator according to one embodiment of the present invention.

FIG. 4 shows one example of a flow in a process for performing a MirrorLink session simulation according to one embodiment of the present invention.

FIG. 5 shows one example of a process for verifying an operation of an application through simulator launch and session event according to one embodiment of the present invention.

FIG. 6 shows one example of a process for verifying an operation through a session event occurring in an application according to one embodiment of the present invention.

FIG. 7 shows one example of a process for checking an image to be actually displayed on an in-vehicle infotainment system through a frame buffer analysis according to one embodiment of the present invention.

FIG. 8 shows one example of a process for using an interface defined in Table 1.

FIG. 9 shows one example of a process for registering a service between a $3^{rd}$ party application and a MirrorLink server simulator and accessing an object according to one embodiment of the present invention.

FIG. 10 shows one example of a visualization tool concept according to one embodiment of the present invention.

BEST MODE FOR CARRYING OUT THE INVENTION

If a connection session can be simulated using an interconnecting protocol between an in-vehicle infotainment (IVI) system and a smartphone, it is possible to conveniently develop and verify an application operating based on connectivity controller (connectivity ECU) technology using minimum hardware capable of driving a toll of providing a simulation function only.

Therefore, the present invention proposes a development tool for a developer of a mobile application for providing an interconnecting function between an in-vehicle infotainment (IVI) system and a smartphone.

A protocol for an interconnecting between an IVI system and a smartphone, which is mentioned in the present invention, is assumed as following the technology 'MirrorLink', which is specialized for Android platform, as one of smartphone mirroring technologies provided by Car Connectivity Consortium. Particularly, according to the general technology 'MirrorLink', a client is an IVI system and a server is a smartphone. Of course, such a protocol is exemplarily provided. If a developing tool according to the present invention is a protocol for an interconnecting function between an IVI system and a smartphone, it is apparent to those skilled in the art that the protocol is applicable to other mobile platforms or connectivity technologies without restrictions.

Primary functions of a development tool according to the present invention can be mainly categorized into a MirrorLink session simulation and a framebuffer analysis tool.

In this case, the MirrorLink session simulator can provide an environment capable of freely emulating configuration/control of a connecting session required for developing/verifying an application to be appropriate for a specific situation (e.g., vehicle currently driven or not, currently operating mode, etc.) desired by an application developer. And, the framebuffer analysis tool provides an environment for checking a type actually displayed on a display in advance to enable a smartphone service to fit a guide for determining a driving suitability for the in-vehicle use of the smartphone service.

Configuration of a development tool according to the present invention is described as follows.

According to one embodiment of the present invention, a MirrorLink application development took can be mainly configured with a MirrorLink session simulator (or a MirrorLink simulator) application and a MirrorLink server simulator application. Roles of the respective simulators are described as follows.

First of all, the MirrorLink session simulator is an application for receiving inputs of configuration values of MirrorLink Client simulation and MirrorLink Server simulation from a user/developer and enabling the MirrorLink Server simulator to simulate a MirrorLink session to correspond to the inputted information. In particular, the MirrorLink session simulator simulates a session between a client and a server based on the integratedly inputted configuration profile values of the client and server. As a result, MirrorLink session information can be provided to a $3^{rd}$ party application. Hence, a developed $3^{rd}$ party application can be verified to normally operate in all MirrorLink function providing devices (i.e., MirrorLink devices) authenticated in the future. For instance, if a control command (key command)

inputted situation is set on the assumption of an event (e.g., a case of rotating a dial type manipulating unit (e.g., rotary knob) in a vehicle (i.e., MirrorLink client)), it is able to verify whether a $3^{rd}$ party application operated appropriately to correspond to the situation or whether a display screen of an IVI system is changed appropriately to correspond to the situation. To this end, the MirrorLink simulator can transmit current MirrorLink session and event values to the MirrorLink Server simulator to match a light-weighted data exchange format such as JavaScript Object Notation.

And, the MirrorLink simulator can provide a screen abiding by the driver distraction guideline for determining un-vehicle use suitability of a developed application and a framebuffer analysis visualization tool for a UI test. To this end, the simulator captures a currently displayed screen and is then able to transmit a screen resized to be suitable for a client information received from the server simulator to the framebuffer analysis visualization tool of the MirrorLink session simulator.

The MirrorLink session simulator can provide a user interface, as shown in FIG. 1, to receive inputs of information required for a MirrorLink session and information of a simulator.

FIG. 1 shows one example of a configuration of a user interface for an information input of a MirrorLink session simulator according to one embodiment of the present invention.

Referring to FIG. 1, a user interface provided by a MirrorLink session simulator may include various fields 111, 113 and 115 capable of inputting setting values to each of the items such as a certification 110, a connection 120, a data service 130, a device information 140, a display 150, and the like.

Meanwhile, the MirrorLink server simulator plays a role as a communication medium between a MirrorLink (session) simulator and a $3^{rd}$ party application. In particular, the server simulator parses the MirrorLink session data received from the MirrorLink simulator and then transmits it to the $3^{rd}$ party application. Alternatively, the server simulator converts a control value received from the $3^{rd}$ party application into a light data format and then transmits it to the MirrorLink simulator. In doing so, it is preferable that the MirrorLink server and the $3^{rd}$ party application exchange information (communicates) with each other using a common API in order to transmit information evenly specialized for the MirrorLink session without depending on a platform. In particular, the $3^{rd}$ party application it is able to access or change a MirrorLink session status information value through a set/get method of the common API, or may receive a changed status information value changed through a callback listener.

In particular, the server simulator plays a role as a MirrorLink server based on information inputted through the MirrorLink session simulator or auto scripting information and also interacts with the $3^{rd}$ party application in a manner of transmitting appropriate call back and return values based on the transmitted client/server configuration information. It is preferable that the communication for the interaction is identically performed using the common API corresponding to a unified scheme without dependency on a manufacturer. Through this, a debugging environment required for implementation verification as a vehicle compatible MirrorLink application can be provided to the $3^{rd}$ party application.

Moreover, the MirrorLink server simulator may further include such functions as a web server, a dummy data loader, an IP (internet protocol) socket communication and the like to communicate with the MirrorLink session simulator. Moreover, the communication (data exchange) with the $3^{rd}$ party application can be performed in RPC (remote procedure call) format based on AIDL (android interface define language).

One example of the above-described MirrorLink server simulator is shown in FIG. 2.

FIG. 2 shows one example of a high level architecture structure of a MirrorLink session simulator according to one embodiment of the present invention.

Referring to FIG. 2, an architecture of a MirrorLink server simulator includes a MirrorLink server simulator service and a MirrorLink session handler. In this case, the MirrorLink server simulator service may be configured with manager modules configured to enable a $3^{rd}$ party application to obtain information of a MirrorLink session between a server and a client and listener modules configured to transmit status information changing according to a specific event. Contents of the manager and listener modules and interface information can be configured as Table 1 in the following.

TABLE 1

| Module | Functionality |
|---|---|
| ICommonAPIService | Main Interface to expose the sub interfaces of MirrorLink Server Simulator<br>- getCommonAPIServiceApiLevel( )<br>: reports the current Common API level supported by the service<br>- applicationStarted(String packagename)<br>: notifies the MirrorLink Server simulator that an application has started<br>- applicationStopping(String packagename)<br>: notifies the MirrorLink Server that an application is stopping<br>- getCertificationManager(String packagename, ICertificationListener listener)<br>: return a ICertificationManger for handling certificates<br>- getConnectionManager(String packagename, IConnectionListener listener)<br>: return a IConnectionManger for requesting connection information<br>- getContextManager(String packagename, IContextListener listener)<br>: return a IContextManger for handling context information<br>- getDataServiceManager(String packagename, IDataServiceListener listener)<br>: return a IDataServiceManger for handling Common Data Bus connection information<br>- getDeviceInfoManager(String packagename, IDeviceInfoListener listener) |

TABLE 1-continued

| Module | Functionality |
|---|---|
| | : return a IDeviceInfoManger for handling device information<br>- getDeviceStatusManager(String packagename, IDeviceStatusListener listener)<br>: return a IDeviceStatusManger for handling device status information<br>- getDisplayManager(String packagename, IDisplayListener listener)<br>: return a IDisplayManger for handling remote display<br>- getEventManager(String packagename, IEventListener listener)<br>: return a IEventManger for handling event mapping<br>- getNotificationManager(String packagename, INotificationListener listener)<br>: return a INotificationManger for handling notifications<br>- getCommonAPIServiceApiLevel( )<br>: report the current common API api level supported by the MirrorLink Server Simulator |
| IDeviceInfoManager | Interface to expose the functions related to the device information<br>- getMirrorLinkClientInformation( )<br>: MirrorLink Client Manufacturer and Model Info<br>- getMirrorLinkSessionVersionMajor( )<br>: MirrorLink Session Major version<br>- getMirrorLinkSessionVersionMinor( )<br>: MirrorLink Session Minor version<br>- getServerVirtualKeyboardSupport( )<br>: provides info about the available virtual keyboard from ML Server<br>- unregister( )<br>: notifies the manager that app is no using it anymore |
| IDeviceInfoListener | Interface to handle the callback for the device information<br>- onDeviceInfoChanged(int majorVersion, int minorVersion, ClientInfo info)<br>: indicates the client info has changed |
| ICertificationManager | Interface to expose the functions related to the certification information of the application<br>- getApplicationCertificationInformation(String entity)<br>: get application certification info<br>- getApplicationCertificationStaus( )<br>: get application certification status<br>- getApplicationCertifyingEntities( )<br>: get application certification entities<br>- unregister( )<br>: notifies the manager that app is no using it anymore |
| ICertificationListener | Interface to handle the callback for the application's certification information<br>- void onCertificationStatusChanged( )<br>: indicate that application certification status has changed |
| IConnectionManager | Interface to expose the functions related to the connection information of MirrorLink<br>- getAudioConnections( )<br>: get establish audio connection<br>- getRemoteDisplayConnection( )<br>: get established remote display connection<br>- isMirrorLInkSessionEstablished( )<br>: indicates whether a MirrorLink Session is established<br>- unregister( )<br>: notifies the manager that app is no using it anymore |
| IConnectionListener | Interface to handle the callback for the connection information of MirrorLink<br>- onAudioConnectionChanged(AudioConnection audio)<br>: callback for established audio connection, which indicate audio connection has changed<br>- onMirrorLinkSessionChanged(boolean mirrorLinkSession)<br>: callback for established MirrorLink session, which indicates the MirrorLink Session has changed<br>- onRemoteDisplayConnectionChanged(int remoteDislayConnection)<br>: callback for established remote display connection<br>: indicate the remote display connection changed |
| IContextManager | Interface to expose the functions related to the context information<br>- resetContextInformation(boolean framebufferConext, booelan audioContext)<br>: reset context information<br>- setAudioContextInformation(boolean audioContext, int audioCategory, boolean handleBlocking)<br>: set audio context information and provides information of the current audio context and whether the app is currently providing audio<br>- setFramebufferContextInformation(int applicationCategory, int contentCategory, int[ ] framebufferArea, boolean handleBlocking)<br>: set and provide the framebuffer context information<br>- unregister( )<br>: notifies the manager that app is no using it anymore |

TABLE 1-continued

| Module | Functionality |
|---|---|
| IContextListener | Interface to handle the callback for the context information<br>- onAudioBlocked(int reason)<br>: callback for audio blocking information, which indicates audio is blocked from ML client<br>- onFramebufferBlocked(int reason, int[ ] framebufferArea)<br>: callback for the framebuffer blocking information, which indicates framebuffer is blocked from ML client |
| IDataServiceManager | Interface to expose the functions related to the Common Data Bus/Simple Binary Protocol data service information<br>- getAvilableServices( )<br>: get available services provided from ML client and supported from ML server<br>- getObject(int serviceId, int objectId)<br>: get an object<br>- registerToService(int serviceId)<br>: register to a service<br>- setObjecT(int serviceId, int objectId, Object obj)<br>: set an object<br>- subscribeObject(int serviceId, int objectId)<br>: subscribe to an object<br>- unregisterFromService( )<br>: unregister from the service<br>- unsubscribeObject( )<br>: unsubscribe from an object<br>- unregister( )<br>: notifies the manager that app is no using it anymore |
| IDataServiceListener | Interface to handle the callback for the Common Data Bus/Simple Binary Protocol data service information<br>- onAvailableServiceChanged(List<String> services)<br>: callback for available services, which indicate changes in available services<br>- onGetDataObjectResponse(int serviceId, int objectId, boolean success, Object obj)<br>: Callback for getting an object<br>- onRegisterForService(int serviceId, boolean success)<br>: Callback for indicating that registering service completed<br>- onSetDataObjectResponse(int serviceId, int objectId, boolean success)<br>: Callback for setting an object<br>- onSubscribeResponse(int serviceId, int objectId, boolean success, int subscriptionType, int interval)<br>: callback for indicating subscribing to an object completed |
| IDeviceStatusManager | Interface to expose the functions related to the device status information<br>- isInDriveMode( )<br>: indicate whether device is on the drive mode<br>- isInNightMode( )<br>: indicate whether device is on the night mode<br>- isInMicrophoneOn( )<br>: indicate whether microphone is on<br>- setMicrophoneOpen(boolean micInput)<br>: set Microphone to open<br>- unregister( )<br>: notifies the manager that app is no using it anymore |
| IDeviceStatusListener | Interface to handle the callback for the device status information<br>- onDriveModeChange(boolean driveMode)<br>: callback for indicating the change of drive mode on ML server device<br>- onMicrophoneStatusChange(boolean micInput)<br>: callback for opening microphone<br>- onNightModeChange(boolean nightMode)<br>: callback for indicating the change of night mode on ML Server device |
| IDisplayManager | Interface to expose the functions related to the display information<br>- getClientPixelFormat( )<br>: get client pixel format being transmitted to ML Client device<br>- getDisplayConfiguration( )<br>: get display configuration of MirrorLink session<br>- setFramebufferOrientationSupport(int framebufferOrientation)<br>: set and inform framebuffer orientation support<br>- unregister( )<br>: notifies the manager that app is no using it anymore |
| IDisplayListener | Interface to handle the callback for the display information<br>- onDisplayConfigurationChanged(DisplayConfig config)<br>: callback for indicating change of display configuration<br>- onPixelFormatChanged(int pixelFormat)<br>: callback for indicating change of Client Pixel format<br>- onServerDisplayConfigurationChanged(int framebufferOrientation)<br>: callback for switching framebuffer orientation |

TABLE 1-continued

| Module | Functionality |
|---|---|
| IEventManager | Interface to expose the functions related to the event information<br>- getEventConfiguration( )<br>: get event configuration of MirrorLink connection from both ML Server & ML Client<br>- getEventMappings( )<br>: get event mappings of ML client events to ML server events<br>- unregister( )<br>: notifies the manager that app is no using it anymore |
| IEventListener | Interface to handle the callback for the event information<br>- onEventConfigurationChanged(EventConfiguration config)<br>: callback for indicating the change of Event configuration<br>- onEventMappingChanged(EventMapping mapping)<br>: callback for indicating and receiving information about event mappings |
| INotificationManager | Interface to expose the functions related to the UPnP Notification service information<br>- cancelNotification(int notificaitonId)<br>: cancel notification from application<br>- getNotificationConfiguration( )<br>: get notification configuration for notification service<br>- getNotificationEnabled( )<br>: get the flag that indicate whether notification is enabled for ML server and client<br>- sendClientNotification(String title, String body, String iconUrl, List<String> actionList)<br>: send notification for client based UI<br>- sendVNCNotification( )<br>: send notification for VNC based UI<br>- setNotifactionSupported(boolean notifcationSupported)<br>: indicate support for UPnP notification from applications<br>- unregister( )<br>: notifies the manager that app is no using it anymore |
| INotificationListener | Interface to handle the callback for the UPnP Notification service information<br>- onNotificationActionReceived(int notificationId, int actionId)<br>: callback for receiving notification action from ML client<br>- onNotificationConfigurationChanged(NotificationConfig confg)<br>: callback for indicating the change of notification configuration<br>- onNotificationEnabledChanged (boolean notiEnabled)<br>: callback for indicating the change of enablement notification |

Moreover, a MirrorLink session simulator application can configure/share MirrorLink session information with a MirrorLink server simulator through a user input or an auto scripting scheme based on RESTful scheme/IP Socket communication (WiFi, USB CDC/NCM, etc.) and is able to perform an event trigger. Such a process is shown in FIG. 3.

FIG. 3 shows one example of a flow between a MirrorLink session simulator and a MirrorLink server simulator according to one embodiment of the present invention.

Referring to FIG. 3, a MirrorLink server simulator application can be launched in form of a virtual device in a general personal computer or may be launched in Android based smartphone. In doing so, session simulation configuration information and the like can be exchanged with a MirrorLink session simulator (i.e., MirrorLink session controller application) via RESTful scheme/IP Socket communication.

If the above-mentioned inter-module flows are integrated, it results in the form shown in FIG. 4.

FIG. 4 shows one example of a flow in a process for performing a MirrorLink session simulation according to one embodiment of the present invention.

Referring to FIG. 4, a client configuration information 421 and a server configuration information 423 can be inputted to a MirrorLink simulator 410 including a framebuffer analysis tool 411 and a MirrorLink client simulator 413. Based on this, a session simulation 440 between the MirrorLink simulator 410 and a server simulator 430 can be performed. Of course, as mentioned in the foregoing description, a $3^{rd}$ party application 450 can communicate with the server simulator 430 via common API.

Operations between the modules shown in FIG. 4 can be represented as flowcharts shown in FIGS. 5 to 7 in the following.

FIG. 5 shows one example of a process for verifying an operation of an application through simulator launch and session event according to one embodiment of the present invention.

Referring to FIG. 5, first of all, a user (i.e., app tester) runs a MirrorLink session simulator application and a MirrorLink server simulator [1, 2]. If each of the simulators is run, the user inputs client and server configuration values to the session simulator [3]. If the configuration value input is completed, the user commands the session simulator to connect the simulators [4]. Hence, a MirrorLink session between the MirrorLink session simulator and the server simulator starts [5].

Once the session starts, the user runs a $3^{rd}$ party application desiring an operation verification [6]. Accordingly, a specific identifier (ID) of the $3^{rd}$ party application is registered at a server simulator [7]. The $3^{rd}$ party application obtains a proxy object (i.e., a replacer module of the server simulator) of the server simulator [8] and then registers a callback listener function (i.e., a function for receiving a status change information, an inter-process communication protocol) at the server simulator [9].

The above-described steps 1 to 9 can be regarded as a preparing process for a full-scale operation verification of an application.

Once the preparing process is completed, the user can set a MirrorLink session event through the session simulator to establish an environment (e.g., driving mode activation, etc.) for a specific operation or status of a vehicle [10]. The session simulator transmits information on the set session event to the server simulator in form of serialized data packet [11]. The server simulator interprets information included in the serialized data packet by parsing the serialized data packet [12] and then transmits the interpreted session event information to the 3$^{rd}$ party application through the callback listener [13]. An operation corresponding to the session event is performed in the 3$^{rd}$ party application, whereby the user can confirm whether an operation suitable for the session event is performed [14].

Subsequently, in case that a status is changed in an application, a process for verifying whether information on the changed status is normally transmitted to a client is described with reference to FIG. 6 as follows.

FIG. 6 shows one example of a process for verifying an operation through a session event occurring in an application according to one embodiment of the present invention. Assume that FIG. 6 shows a process behind the step 10 shown in FIG. 5 at least.

Referring to FIG. 6, status change information (e.g., user's input of a specific command, external message reception, etc.) can be inputted to the 3$^{rd}$ party application [15]. The 3$^{rd}$ party application sets the status change information in the server simulator [16]. The server simulator generates a session event information corresponding to the status change information in form of a serialized data packet [17] and then transmits it to the session simulator [18]. The session simulator interprets the session event information by parsing the received serialized data packet [19] and then updates mirror session status and event values [20].

A result of the above process can be visually confirmed by the user through a framebuffer analysis. This is described with reference to FIG. 7 as follows.

FIG. 7 shows one example of a process for checking an image to be actually displayed on an in-vehicle infotainment system through a frame buffer analysis according to one embodiment of the present invention.

Referring to FIG. 7, the user can input a command for capturing a current framebuffer to the session simulator [21]. Accordingly, the session simulator generates a serialized data packet for capturing a current framebuffer [22] and then transmits it to the server simulator [23]. The server simulator checks the capture request for the current framebuffer by parsing the serialized data packet [24], captures a framebuffer of the 3$^{rd}$ party application [25], and then transmits the captured framebuffer to the session simulator [26]. The session simulator analyzes the transmitted framebuffer [27] and then displays the captured framebuffer together with driver distraction guideline related information [28].

The methods described with reference to FIGS. 5 to 7 require a MirrorLink application developer to understand minimum information such as MirrorLink session information and common API only and enable development environment establishment further facilitated in comparison with the purchase and settings of the real MirrorLink client and server equipments.

Interface required for the communication between the MirrorLink server simulator and the MirrorLink session simulator can be configured as Table 2 in the following.

TABLE 2

| Category | Method | Argument |
| --- | --- | --- |
| Device Info | void setMirrorLinkVersion (int majorVersion, int minorVersion, boolean success) | - majorVersion<br>: MirrorLink major version<br>- minorVersion<br>: MirrorLink minor version<br>- success<br>: flag to indicate the availability of info |
| | void setMirrorLinkClientInfo (ClientInfo clientInfo, boolean callbackTrigger) | - ClientInfo<br>: refer to ClientInfo.java<br>- callbackTrigger<br>: true/false |
| | void setServerVirtualKeyboardSupport (boolean available, boolean touchSupport, boolean knobSupport, boolean driveMode) | - available<br>:availability of a virtual keyboard<br>:true/false<br>- touchSupport<br>: indicate whether the virtual keyboard supports touch events<br>: true/false<br>- knobSupport<br>: indicate whether virtual keyboard support knob events<br>: true/false<br>- driveMode<br>: indicate whether driver distraction guideline is followed<br>: true/false |
| Certification Info | void setApplicationCertificationStatus (boolean certificateAvailable, boolean advertisedAsCertified) | - certificateAvailable<br>: indicate whether a valid certificate exists<br>: true/false<br>- advertisedAsCertified<br>: indicate whether application has been advertised in UPnP |
| | void setAppCertifyingEntities (CertificateInfo certiInfo) | - CerticateInfo<br>: refer to CertificateInfo.java |

TABLE 2-continued

| Category | Method | Argument |
|---|---|---|
| Connection Info | void setAudioConnection (AudioConnection connect, boolean callbackFlag) | - connect<br>: refer to AudioConnection.java<br>- callbackFlag<br>: indicate whether connection is established<br>:true/false |
| | void setRemoteDisplayConnection (byte connect, boolean callbackFlag) | - connect<br>: 0x00: No connection established<br>: 0x00: VNC<br>: 0x01: HSML<br>: 0x02: WFD<br>: 0xFF: Other<br>- callbackFlag<br>: indicate whether connection is established<br>:true/false |
| Display Info | void setDisplayConfig (DisplayConfig config, boolean callbackFlag) | - config<br>: refer to DisplayConfig.java<br>- callbackFlag<br>: flag to indicate whether information is correctly set<br>:true/false |
| | void setClientPixelFormat (byte pixelInfo, boolean callbackFlag) | - pixelInfo<br>: 0x01 - ARGB888<br>: 0x02 - RGB888<br>: 0x03 - ARGB565<br>: 0x04 - RGB555<br>: 0x05 - RGB444<br>: 0x06 - RGB343<br>: 0x07 - 16 Bit Gray<br>: 0x08 - 8 Bit Gray<br>- callbackFlag<br>: flag to indicate whether information is correctly set<br>:true/false |
| EventMapping Info | void setEventConfig (EventConfig config, boolean callbackFlag) | - config<br>: refer to EventConfig.java<br>- callbackFlag<br>: flag to indicate whether information is correctly set<br>:true/false |
| | void addEventMappings (int remoteEvent, int localEvent, boolean callbackFlag) | - remoteEvent<br>: key event value of the remote event<br>: value = 0<br>- localEvent<br>: key event value of local event<br>: value = 1<br>- callbackFlag<br>: flag to indicate whether information is correctly set<br>:true/false |
| Context Info | void setAudioBlocking (int blockingReason) | - blockingReason<br>: reason for blocking |
| | void setVideoBlocking (int blockingReason, int[ ] framebufferArea) | - blockingReason<br>: reason for blocking<br>- framebufferArea<br>: framebufferArea[0] = height<br>: framebufferArea[1] = width<br>: framebufferArea[2] = x position<br>: framebufferArea[3] = y position |
| | void setFramebufferContextInformation (int appCategory, int videoContentCategory Int[ ] framebufferArea, boolean handleBlocking) | - appCategory<br>: category of the application<br>- videoContentCategory<br>: category of the content<br>-- framebufferArea<br>: framebufferArea[0] = height<br>: framebufferArea[1] = width<br>: framebufferArea[2] = x position<br>: framebufferArea[3] = y position<br>- handleBlocking<br>: indicate whether blocking is on/off<br>: true/false |

TABLE 2-continued

| Category | Method | Argument |
|---|---|---|
| | void setAudioContextInfo (boolean audioContent, int[ ] audioCategory, boolean handleBlocking) | - audioContent<br>: application provides audio context<br>- audioCategory<br>: audio content category<br>- handleBlocking<br>: indicate whether blocking is on/off<br>: true/false |
| DeviceStatus Info | void setDriveMode (boolean driveMode) | - driveMode<br>: flag enabling drive mode for the app<br>: true/false |
| | void setMicrophoneActive (boolean micInput) | - micInput<br>: flag whether mic input is enabled<br>: true/false |
| | void setMicrophoneOpen (boolean micInput, boolean voiceInput) | - micrInput<br>: flag whether mic input is enabled<br>: true/false<br>- voiceInput<br>: flag whether voice input is enabled<br>: true/false |
| | void setNightMode (boolean nightMode) | - nightMode<br>: flag enabling night mode for the app<br>: true/false |
| DataService Info | void subscribeToObject (int serviceId, int objectId, boolean success, Int subscriptionType, int interval) | - serviceId<br>: service identifier<br>- objectId<br>: hash value of the object<br>- success<br>: flag to indicate whether the action is successful<br>- subscriptionType<br>: 0x00 = regular interval<br>: 0x01 = on change<br>: 0x02 = automatic<br>- interval<br>: regular time interval in ms<br>: MUST be 0x00 for on change<br>: MUST be 0x02 for automatic |
| | void setObject (int serviceId, int objectId, Object value) | - serviceId<br>: service identifier<br>- objectId<br>: hash value of the object<br>- object value<br>: user define object value |
| Notification Info | void setAction (int notificationId, int actionId) | - notificationId<br>: notificiation identifier<br>- actionId<br>: action Identifier |
| | void sendClientNotification (string notiTitle, string notiBody, string iconUrl, List<String> actionList, int notificationID) | - notiTitle<br>: title of the notification event<br>- notiBody<br>: body of the notification event<br>- iconUrl<br>: url to the icon of the notification<br>- actionList<br>: list of action belonging to the notification<br>- notificationID<br>: notification Identifier |
| | void sendVNCNotification (int notificationID) | - notificationID<br>: notification Identifier |
| | void cancelNotification (int notificationID) | - notificationID<br>: notification Identifier |

Through the interface shown in Table 2, the MirrorLink server simulator can configure or confirm information of a framebuffer, a display, an input controller and the like of the MirrorLink client, event configuration of the MirrorLink client/server, and contents related to context information of the application service.

Meanwhile, in Android platform, it is basically impossible for one process to directly access another process on a memory. Hence, according to the present embodiment, it is proposed to enable conversation between two processes by defining an inter-process communication protocol (RPC: remote process call) to use resource or function existing in another process. This is described with reference to FIG. 8 as follows.

FIG. 8 shows one example of a process for using an interface defined in Table 1.

Referring to FIG. 8, a process (e.g., activity process) of a 3$^{rd}$ party application can access a MirrorLink server simulator service corresponding to a process for simulating a MirrorLink session through a service registration. The 3$^{rd}$ party application stores a replacer object of the MirrorLink server simulator service returned on registration and is able to access a manager module configured to manage Mirror- Link session related data through the replacer object. Moreover, through API of the above-mentioned manager module, the 3rdd party application can receive and modify a MirrorLink session value. To this end, the server simulator can have a unique service name (e.g. com.mirrorlink.android.simulatorservice). Accesses of all applications that register and transmit an intent named "com.mirrorLink.android.simulatorservice.BIND" of a unique name can be granted. And, the server simulator service transmits a response for launch to the application having sent a service connection message. In case of invoking a disconnection from the $3^{rd}$ party application, it is able to cancel the connection by recognizing that the service will not be used any longer.

Meanwhile, in order for the 3rd party application to be connected to the MirrorLink simulator, it is preferable that authority "com.mirrorlink.android.simulatorservice.ACCESS_PERMISSION" is registered on development.

An overall process for a $3^{rd}$ party application to use a MirrorLink server simulator is illustrated in FIG. 9.

FIG. 9 shows one example of a process for registering a service between a $3^{rd}$ party application and a MirrorLink server simulator and accessing an object according to one embodiment of the present invention. Referring to FIG. 9, a $3^{rd}$ party application registers a MirrorLink server simulator service to use a MirrorLink server simulator and is able to access an information manager & callback module object.

Meanwhile, since the $3^{rd}$ party application is eventually usable in a vehicle, a user interface should be configured to be appropriate for a driver distraction guide not to interrupt a driver in the course of driving the vehicle. Hence, required is a tool for checking whether the $3^{rd}$ party application can use a screen in the course of driving to be suitable for a MirrorLink session information value. Such a tool function can be provided by a framebuffer analysis visualization tool.

The concept of the high level requirements supposed to be provided to the visualization tool is described as follows.
<High Level Requirements>
User Interface (UI) to configure the physical size and resolution
Method to resize framebuffer
Method to display or save resized framebuffer
Method to indicate the 5% display threshold
Mechanism that allows the user to save the scaled framebuffer to a file with a single click or shortcut
The concept may be categorized into Android SDK extension type and PC installable App type. This is described with reference to FIG. 10 as follows.

FIG. 10 shows one example of a visualization tool concept according to one embodiment of the present invention.

If a visualization tool is implemented into Android SDK extension type, it is able to an existing provide Android development environment with a new function for checking visualization in plug-in form. For instance, as shown in FIG. 10 (a), the present function can be provided in a manner of transforming Layout.xml 1040 configuring a general UI into a real screen 1050.

Through the above-described simulators and the $3^{rd}$ party application verifying method using the same, a $3^{rd}$ party application developer can easily develop a UT suitable for simulation and driving regulations of Smartphone & IVI connectivity technology.

INDUSTRIAL APPLICABILITY

The present invention is described centering on Android platform based MirrorLink technology. Yet, this is exemplary and the present invention is applicable to any technologies capable of providing an interconnecting function through a connection between an in-vehicle infotainment system and a mobile device.

The invention claimed is:

1. A method performed by a simulation system including a first simulator that corresponds to a client simulator and a second simulator that corresponds to a server simulator, the method comprising:
   receiving, by the first simulator, first configuration information for the first simulator and second configuration information for the second simulator;
   connecting, based on the first configuration information and the second configuration information, the first simulator to the second simulator;
   in response to connecting the first simulator to the second simulator, storing session status information for a session between the first simulator and the second simulator;
   determining that a verification target application has launched;
   in response to determining that the verification target application has launched, obtaining, by the second simulator, data identifying the verification target application from the verification target application;
   providing, by the second simulator, a proxy object of the second simulator to the verification target application;
   receiving, by the second simulator, one or more communication protocols for communicating between the second simulator and the verification target application;
   storing, by the second simulator, the one or more communication protocols for communicating between the second simulator and the verification target application;
   displaying, by the first simulator, an image provided by the verification target application;
   receiving, by the first simulator, user input for capturing an image from a collection of images provided by the verification target application;
   providing, by the first simulator, the user input to the second simulator;
   in response to the user input, capturing, by the second simulator, an image from a collection of images provided by the verification target application;
   providing, by the second simulator, the captured image and client information to the first simulator;
   resizing, by the first simulator, the captured image based on the client information received from the second simulator; and
   displaying, by the first simulator, the resized image.

2. The method of claim 1, further comprising:
   receiving, by the first simulator, data for a first session event;
   providing, by the first simulator, the data for the first session event to the second simulator;
   providing, by the second simulator, the data for the first session event to the verification target application using the one or more communication protocols; and
   performing an operation based on the data for the first session event in the verification target application.

3. The method of claim 2, wherein providing, by the first simulator, the data for the first session event to the second simulator comprises:
   generating, by the first simulator, a data packet including the data for the first session event;
   providing, by the first simulator, the data packet to the second simulator; and
   parsing, by the second simulator, the data packet provided by the first simulator.

4. The method of claim 1, further comprising:
receiving, by the second simulator, data for a second session event, the data for the second session event indicating a status change of the verification target application;
generating, by the second simulator, status change information from the received data for the second session event;
providing, by the second simulator, the status change information to the first simulator; and
updating, by the first simulator, the session status information based on the status change information.

5. The method of claim 4, further comprising:
generating, by the second simulator, a data packet including the status change information;
providing, by the second simulator, the data packet to the first simulator; and
parsing, by the first simulator, the status change information provided by the second simulator.

6. The method of claim 1, further comprising:
generating, by the first simulator, a data packet including the user input;
providing, by the first simulator, the data packet to the second simulator; and
parsing, by the second simulator, the data packet provided by the first simulator.

7. The method of claim 1, wherein the method performed by the simulation system comprises a method performed by a first simulator that is configured to simulate a vehicle system and a second simulator that is configured to simulate a user device.

8. The method of claim 1, further comprising:
enabling the verification target application to provide information to a vehicle.

9. A system comprising:
a first simulator that corresponds to a client simulator;
a second simulator that corresponds to a server simulator; and
wherein the first simulator further includes a framebuffer analysis tool and a Mirror link client simulator,
wherein the second simulator further includes (i) manager modules to enable a verification target application to obtain information of a Mirror link session between the first simulator and the second simulator, and (ii) listener modules configured to transmit status information changing according to a specific event,
one or more storage devices which include hardware components configured to store instructions that when executed by the first simulator or the second simulator cause the first simulator or the second simulator to perform operations comprising:
receiving, by the first simulator, first configuration information for the first simulator and second configuration information for the second simulator;
connecting, based on the first configuration information and the second configuration information, the first simulator to the second simulator;
in response to connecting the first simulator to the second simulator, storing session status information for a session between the first simulator and the second simulator;
determining that a verification target application has launched;
in response to determining that the verification target application has launched, obtaining, by the second simulator, data identifying the verification target application from the verification target application;
providing, by the second simulator, a proxy object of the second simulator to the verification target application;
receiving, by the second simulator, one or more communication protocols for communicating between the second simulator and the verification target application; and
storing, by the second simulator, the one or more communication protocols for communicating between the second simulator and the verification target application;
displaying, by the first simulator, an image provided by the verification target application;
receiving, by the first simulator, user input for capturing an image from a collection of images provided by the verification target application;
providing, by the first simulator, the user input to the second simulator;
in response to the user input, capturing, by the second simulator, an image from a collection of images provided by the verification target application;
providing, by the second simulator, the captured image and client information to the first simulator;
resizing, by the first simulator, the captured image based on the client information received from the second simulator; and
displaying, by the first simulator, the resized image.

10. The system of claim 9, the operations further comprising:
receiving, by the first simulator, data for a first session event;
providing, by the first simulator, the data for the first session event to the second simulator;
providing, by the second simulator, the data for the first session event to the verification target application using the one or more communication protocols; and
performing an operation based on the data for the first session event in the verification target application.

11. The system of claim 10, the operations further comprising:
generating, by the first simulator, a data packet including the data for the first session event;
providing, by the first simulator, the data packet to the second simulator; and
parsing, by the second simulator, the data packet provided by the first simulator.

12. The system of claim 9, the operations further comprising:
receiving, by the second simulator, data for a second session event, the data for the second session event indicating a status change of the verification target application;
generating, by the second simulator, status change information from the received data for the second session event;
providing, by the second simulator, the status change information to the first simulator; and
updating, by the first simulator, the session status information based on the status change information.

13. The system of claim 12, the operations further comprising:
generating, by the second simulator, a data packet including the status change information;
providing, by the second simulator, the data packet to the first simulator; and
parsing, by the first simulator, the status change information provided by the second simulator.

14. The system of claim 9, the operations further comprising:

generating, by the first simulator, a data packet including the user input;

providing, by the first simulator, the data packet to the second simulator; and parsing, by the second simulator, the data packet provided by the first simulator.

15. The system of claim 9, wherein the first simulator is configured to simulate a vehicle system and a second simulator is configured to simulate a user device.

16. The system of claim 9, the operations further comprising:

enabling the verification target application to provide information to a vehicle.

\* \* \* \* \*